(12) United States Patent
Domino et al.

(10) Patent No.: US 6,792,282 B1
(45) Date of Patent: *Sep. 14, 2004

(54) MULTIPLE STEP SWITCHED TRANSLATION LOOP FOR POWER AMPLIFIER FEEDBACK CONTROL

(75) Inventors: William J. Domino, Yorba Linda, CA (US); Dmitriy Rozenblit, Irvine, CA (US); Morten Damgaard, Laguna Hills, CA (US); Nooshin D. Vakilian, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 396 days.

This patent is subject to a terminal disclaimer.

(21) Appl. No.: 09/666,698

(22) Filed: Sep. 21, 2000

(51) Int. Cl.[7] .................................................. H04B 1/02
(52) U.S. Cl. .................... 455/522; 455/102; 455/715.1; 455/118; 455/126
(58) Field of Search ...................... 455/69, 91, 115–116, 455/127, 42, 114.3, 127.3, 522, 126, 127.1, 127.2, 102, 115.1, 118; 330/278; 332/144, 149

(56) References Cited

U.S. PATENT DOCUMENTS

| | | | | |
|---|---|---|---|---|
| 5,430,416 A | * | 7/1995 | Black | 332/145 |
| 5,507,017 A | * | 4/1996 | Whitmarsh et al. | 455/126 |
| 6,060,950 A | * | 5/2000 | Groe | 330/279 |
| 6,072,998 A | * | 6/2000 | Kaku | 455/234.2 |
| 6,191,653 B1 | * | 2/2001 | Camp et al. | 330/129 |
| 6,229,397 B1 | * | 5/2001 | Miura | 330/289 |
| 6,255,912 B1 | * | 7/2001 | Laub | 331/25 |
| 6,295,442 B1 | * | 9/2001 | Camp et al. | 455/102 |
| 6,480,704 B1 | * | 11/2002 | Pakonen | 455/126 |
| 6,633,751 B1 | * | 10/2003 | Damgaard et al. | 455/126 |
| 6,650,875 B1 | * | 11/2003 | Rozenblit et al. | 455/91 |

* cited by examiner

Primary Examiner—William Trost
Assistant Examiner—Brandon J Miller
(74) Attorney, Agent, or Firm—Needle & Rosenberg, P.C.

(57) ABSTRACT

A translation loop modulator and power amplifier in a phase and amplitude modulated transmission environment includes a translation loop having a phase locked loop and that is configured to receive a first modulated signal (PM) and that is also configured to provide a frequency specific modulated signal. The invention also includes a power amplifier configured to receive the frequency specific modulated signal, a variable gain element configured to provide a second modulated signal (AM) to the power amplifier and a switching element configured to receive a portion of an output of the translation loop and a portion of an output power of the power amplifier. The switching element is configured to apply the output portion of the translation loop to an input of the translation loop during a first time period and apply the detected output power portion of the power amplifier to the input of the translation loop during a second time period, thus allowing the phase locked loop in the translation loop to correct for any phase shift caused by the power amplifier.

32 Claims, 6 Drawing Sheets

MULTIPLE STEP SWITCHED TRANSLATION LOOP FOR POWER AMPLIFIER FEEDBACK CONTROL

BACKGROUND OF THE INVENTION

1. Field of the Invention

This invention relates generally to maximizing radio frequency transmission power in a wireless communication device transmitter, and, more particularly, to a multiple step switched translation loop for power amplifier feedback control.

2. Related Art

With the increasing availability of efficient, low cost electronic modules, mobile communication systems are becoming more and more widespread. For example, there are many variations of communication schemes in which various frequencies, transmission schemes, modulation techniques and communication protocols are used to provide two-way voice and data communications in a handheld telephone like communication handset. The different modulation and transmission schemes each have advantages and disadvantages.

As these mobile communication systems have been developed and deployed, many different standards, to which these systems must conform, have evolved. For example, in the United States, portable communications systems complying with the IS-136 standard specify the use of a particular modulation scheme and access format. In the case of IS-136, the modulation scheme can be 8-quadrature phase shift keying (8QPSK), offset π/4 differential quadrature phase shift keying (π/4 -DQPSK) or variations and the access format is time division multiple access (TDMA). Other standards may require the use of, for example, code division multiple access (CDMA).

Similarly, in Europe, the global system for mobile communications (GSM) standard requires the use of the gaussian minimum shift keying (GMSK) modulation scheme in a narrowband TDMA access environment.

Furthermore, in a typical GSM mobile communication system using narrowband TDMA technology, a GMSK modulation scheme supplies a very clean phase modulated (PM) transmit signal to a non-linear power amplifier directly from an oscillator. In such an arrangement, a non-linear power amplifier, which is highly efficient, can be used, thus allowing efficient transmission of the phase-modulated signal and minimizing power consumption. Because the modulated signal is supplied directly from an oscillator, the need for filtering, either before or after the power amplifier, is minimized. Other transmission standards, such as that employed in IS136, however, use a modulation scheme in which both a PM signal and an amplitude modulated (AM) signal are transmitted. Standards such as these increase the data rate without increasing the bandwidth of the transmitted signal. Unfortunately, existing GSM modulation schemes are not easily adapted to transmit a signal that includes both a PM component and an AM component. One reason for this difficulty is that in order to transmit a signal containing a PM component and an AM component, a highly linear power amplifier is required. Unfortunately, highly linear power amplifiers are very inefficient, thus consuming significantly more power than a non-linear power amplifier and drastically reducing the life of the battery or other power source.

This condition is ftuther complicated because transmitters typically employed in GSM communication systems transmit in bursts and must be able to control the ramp-up of the transmit power as well as have a high degree of control over the output power level over a wide power range. In GSM this power control is typically performed using a closed feedback loop in which a portion of the signal output from the power amplifier is compared with a reference signal and the resulting error signal is fed back to the input of the power amplifier.

When attempting to include a PM component and an AM component in a GSM type modulation system, the power control loop will tend to fight against the amplitude variations present in the signal while attempting to maintain the desired output power. In such an arrangement, the power control loop tends to cancel the AM portion of the signal.

In such systems in which transmit signals contain both PM and AM components, the output power can be controlled by applying a pre-determined control voltage to the power amplifier. Unfortunately, this requires the use of a highly linear, and therefore very inefficient, power amplifier. In non-burst transmission systems the output power may be controlled by a feedback loop having a time-constant that is very low compared to the time-constant of the amplitude variations of the modulator. Another known method to control the output power is to "pre-distort" the modulated signal in such a way that the power control loop will cancel the effect of the predistortion. In such a method, the amplitude information is passed through a transfer function that is the inverse of the power control loop transfer function. Unfortunately, these methods are costly and inefficient.

Furthermore, in those transmission standards in which both a PM signal and an AM signal are sent to a power amplifier, unless the power amplifier is very linear, it may distort the combined transmission signal by causing undesirable AM to PM conversion. This conversion is detrimental to the transmit signal and can require the use of a costly and inefficient linear power amplifier.

With the increasing desirability of developing one worldwide portable communication standard, it would be desirable to allow portable transceivers to transmit a signal containing both a PM component and an AM component, while maximizing the efficiency of the power amplifier. Furthermore, as the GSM standard evolves further, such as with the development of enhanced data rates for GSM evolution (EDGE), it is desirable to have one portable transceiver that may operate in all systems.

SUMMARY

The invention provides a multiple step switched translation loop for power amplifier feedback control that maximizes power amplifier efficiency.

The invention maximizes the efficiency of a power amplifier by providing a multiple step switched translation loop for power amplifier feedback control that incorporates a phase locked loop (PLL) frequency upconverter. During an initial portion of a transmit burst, the PLL receives feedback only from a transmit voltage controlled oscillator (VCO). After the output of the VCO is sufficient to drive the power amplifier, the input to the feedback loop in the upconverter is switched so that the PLL receives its input from the output of the power amplifier. A control signal supplied to the power amplifier includes an AM signal. The output of the power amplifier is directed through a variable gain element, which removes the AM portion of the power amplifier output. In this manner, the output of the power amplifier is supplied to the input of the upconverter, thus allowing the PLL to correct for phase shift induced not only by the VCO but also by the power amplifier.

Related methods of operation and computer readable media are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. Moreover, in the figures, like reference numerals designate corresponding parts throughout the different views.

DETAILED DESCRIPTION

Figure 1:
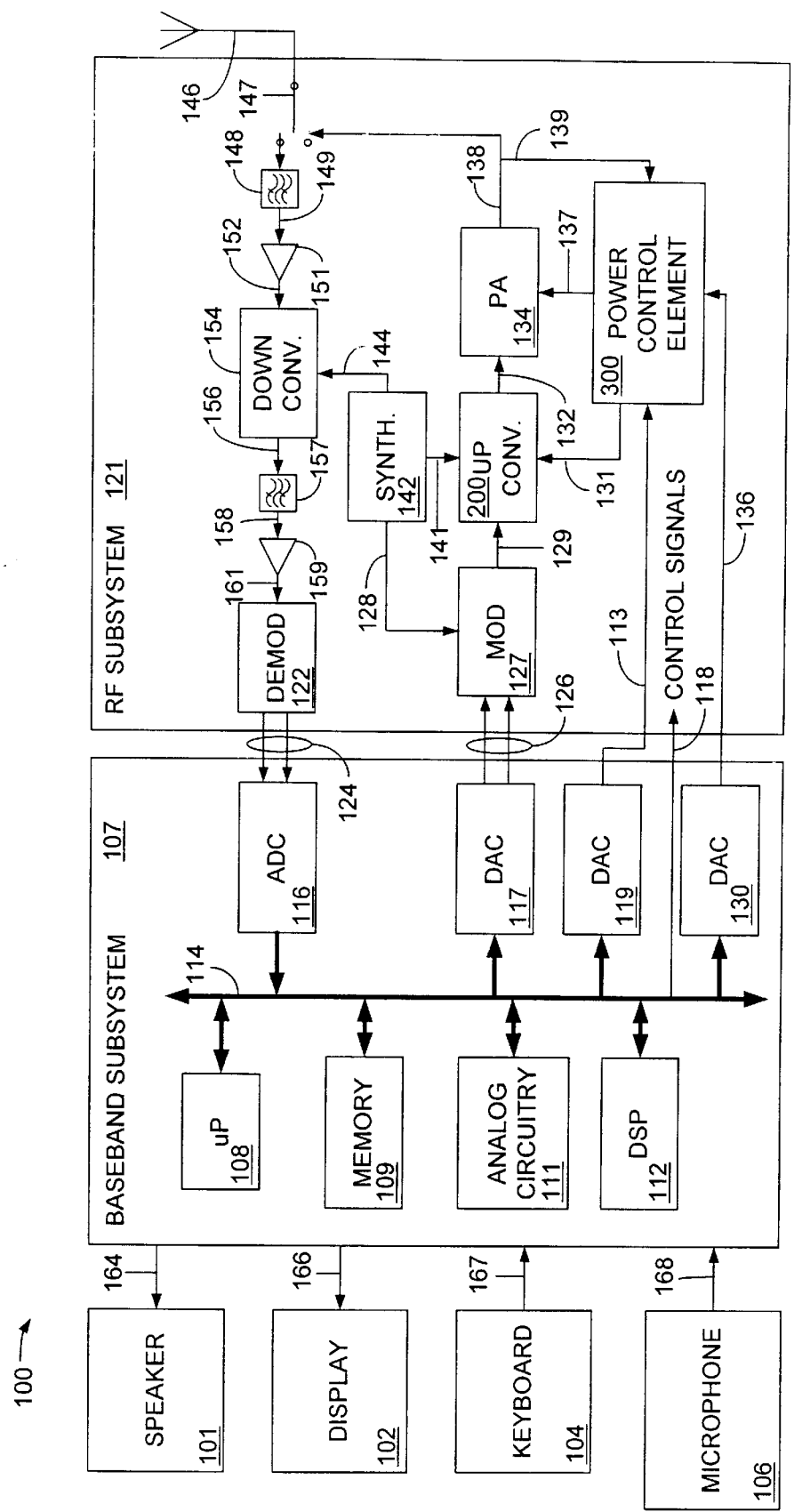
FIG. 1 is a block diagram illustrating a simplified portable transceiver.

Although described with particular reference to portable transceiver, the multiple step switched translation loop of the invention can be implemented in any system in which a combined signal including a PM component and an AM component is supplied to a power amplifier. Furthermore, the multiple step switched translation loop is applicable to any system in which it is desirable to implement a closed power control feedback loop and in which a PM signal and an AM signal are supplied to a linear power amplifier.

Furthermore, the multiple step switched translation loop of the invention can be implemented in software, hardware, or a combination of hardware and software. In a preferred embodiment(s), selected portions of the multiple step switched translation loop are implemented in hardware and software. The hardware portion of the invention can be implemented using specialized hardware logic. The software portion can be stored in a memory and be executed by a suitable instruction execution system (microprocessor). The hardware implementation of the multiple step switched translation loop can include any or a combination of the following technologies, which are all well known in the art: a discrete logic circuit(s) having logic gates for implementing logic functions upon data signals, an application specific integrated circuit having appropriate logic gates, a programmable gate array(s) (PGA), a field programmable gate array (FPGA), etc.

Furthermore, the multiple step switched translation loop software, which comprises an ordered listing of executable instructions for implementing logical functions, can be embodied in any computer-readable medium for use by or in connection with an instruction execution system, apparatus, or device, such as a computer-based system, processor-containing system, or other system that can fetch the instructions from the instruction execution system, apparatus, or device and execute the instructions.

In the context of this document, a "computer-readable medium" can be any means that can contain, store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a nonexhaustive list) of the computer-readable medium would include the following: an electrical connection (electronic) having one or more wires, a portable computer diskette (magnetic), a random access memory (RAM), a read-only memory (ROM), an erasable programmable read-only memory (EPROM or Flash memory) (magnetic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

FIG. 1 is a block diagram illustrating a simplified portable transceiver 100. Portable transceiver 100 includes speaker 101, display 102, keyboard 104, and microphone 106, all connected to baseband subsystem 107. In a particular embodiment, portable transceiver 100 can be, for example but not limited to, a portable telecommunication handset such as a mobile cellular-type telephone. Speaker 101 and display 102 receive signals from baseband subsystem 107 via connections 164 and 166, respectively, as known to those skilled in the art. Similarly, keyboard 104 and microphone 106 supply signals to baseband subsystem 107 via connections 167 and 168, respectively. Baseband subsystem 107 includes microprocessor ($\mu$P) 108, memory 109, analog circuitry 111, and digital signal processor (DSP) 112 in communication via bus 114. Bus 114, although shown as a single bus, may be implemented using multiple busses connected as necessary among the subsystems within baseband subsystem 107. Microprocessor 108 and memory 109 provide the signal timing, processing and storage functions for portable transceiver 100. Analog circuitry 111 provides the analog processing functions for the signals within baseband subsystem 107. Baseband subsystem 107 provides control signals to radio frequency (RF) subsystem 121 via connection 118. Although shown as a single connection 118, the control signals may originate from DSP 112 or from microprocessor 108, and are supplied to a variety of points within RF subsystem 121. It should be noted that, for simplicity, only the basic components of portable transceiver 100 are illustrated herein.

Baseband subsystem 107 also includes analog-to-digital converter (ADC) 116 and digital-to-analog converters (DACs) 117, 119 and 130. ADC 116, DAC 117 DAC 119 and DAC 130 also communicate with microprocessor 108, memory 109, analog circuitry 111 and DSP 112 via bus 114. DAC 117 converts the digital communication information within baseband subsystem 107 into an analog signal for transmission to RF subsystem 121 via connection 126. In accordance with an aspect of the invention, DAC 119 provides a reference voltage power level signal to power control element 200 via connection 113 and DAC 130 provides the AM signal to power control element 300 via connection 136. Alternatively, circuitry (not shown) could be placed in power control element 300 to receive the output of DAC 117 via connection 126 and derive the AM signal using the equation Amplitude (dB)=20log(SQRT(I^2+Q^2)).

Connection 126, while shown as two directed arrows, includes the information that is to be transmitted by RF subsystem 121 after conversion from the digital domain to the analog domain.

RF subsystem 121 includes modulator 127, which, after receiving a frequency reference signal, also called a "local oscillator," signal, or "LO," from synthesizer 142 via connection 128, modulates the received analog information and provides a phase modulated signal via connection 129 to upconverter 200. Upconverter 200 also receives a frequency reference signal from synthesizer 142 via connection 141. Synthesizer 142 determines the appropriate frequency to which upconverter 200 will upconvert the phase modulated signal on connection 129.

Upconverter 200 supplies the phase-modulated signal via connection 132 to power amplifier 134. Power amplifier 134 amplifies the modulated signal on connection 132 to the appropriate power level for transmission via connection 138 to antenna 146. Illustratively, switch 147 controls whether the amplified signal on connection 138 is transferred to antenna 146 or whether a received signal from antenna 146 is supplied to filter 148. The operation of switch 147 is controlled by a control signal from baseband subsystem 107 via connection 118.

A portion of the amplified transmit signal energy on connection 138 is supplied via connection 139 to power control element 300. Power control element 300, in accordance with an aspect of the invention, forms a closed power control feedback loop and supplies an AM component of the transmit signal via connection 137 to power amplifier 134 and also supplies a power control feedback signal via connection 131 to upconverter 200. The operation of power control element 300 will be described in further detail with respect to FIGS. 2 through 5.

A signal received by antenna 146 will, at the appropriate time determined by baseband system 107, be directed via switch 147 to receive filter 148. Receive filter 148 will filter the received signal and supply the filtered signal on connection 149 to low noise amplifier (LNA) 151. Receive filter 148 is a bandpass filter, which passes all channels of the particular cellular system in which the portable transceiver 100 is operating. As an example, for a 900 MHz GSM system, receive filter 148 would pass all frequencies from 935.1 MHz to 959.9 MHZ, covering all 124 contiguous channels of 200 kHz each. The purpose of this filter is to reject all frequencies outside the desired region. LNA 151 amplifies the very weak signal on connection 149 to a level at which downconverter 154 can translate the signal from the transmitted frequency back to a baseband frequency. Alternatively, the functionality of LNA 151 and downconverter 154 can be accomplished using other elements, such as for example but not limited to, a low noise block downconverter (LNB).

Downconverter 154 receives a frequency reference signal, also called a "local oscillator" signal, or "LO," from synthesizer 142, via connection 144, which signal instructs the downconverter 154 as to the proper frequency to which to downconvert the signal received from LNA 151 via connection 152. The downconverted frequency is called the "intermediate frequency," or "IF." Downconverter 154 sends the downconverted signal via connection 156 to channel filter 157, also called the "IF filter." Channel filter 157 filters the downconverted signal and supplies it via connection 158 to amplifier 159. The channel filter 157 selects the one desired channel and rejects all others. Using the GSM system as an example, only one of the 124 contiguous channels is actually to be received. After all channels are passed by receive filter 148 and downconverted in frequency by downconverter 154, only the one desired channel will appear precisely at the center frequency of channel filter 157. The synthesizer 142, by controlling the local oscillator frequency supplied on connection 144 to downconverter 154, determines the selected channel. Amplifier 159 amplifies the received signal and supplies the amplified signal via connection 161 to demodulator 122. Demodulator 122 recovers the transmitted analog information and supplies a signal representing this information via connection 124 to ADC 116. ADC 116 converts these analog signals to a digital signal at baseband frequency and transfers it via bus 114 to DSP 112 for further processing.

Figure 2:
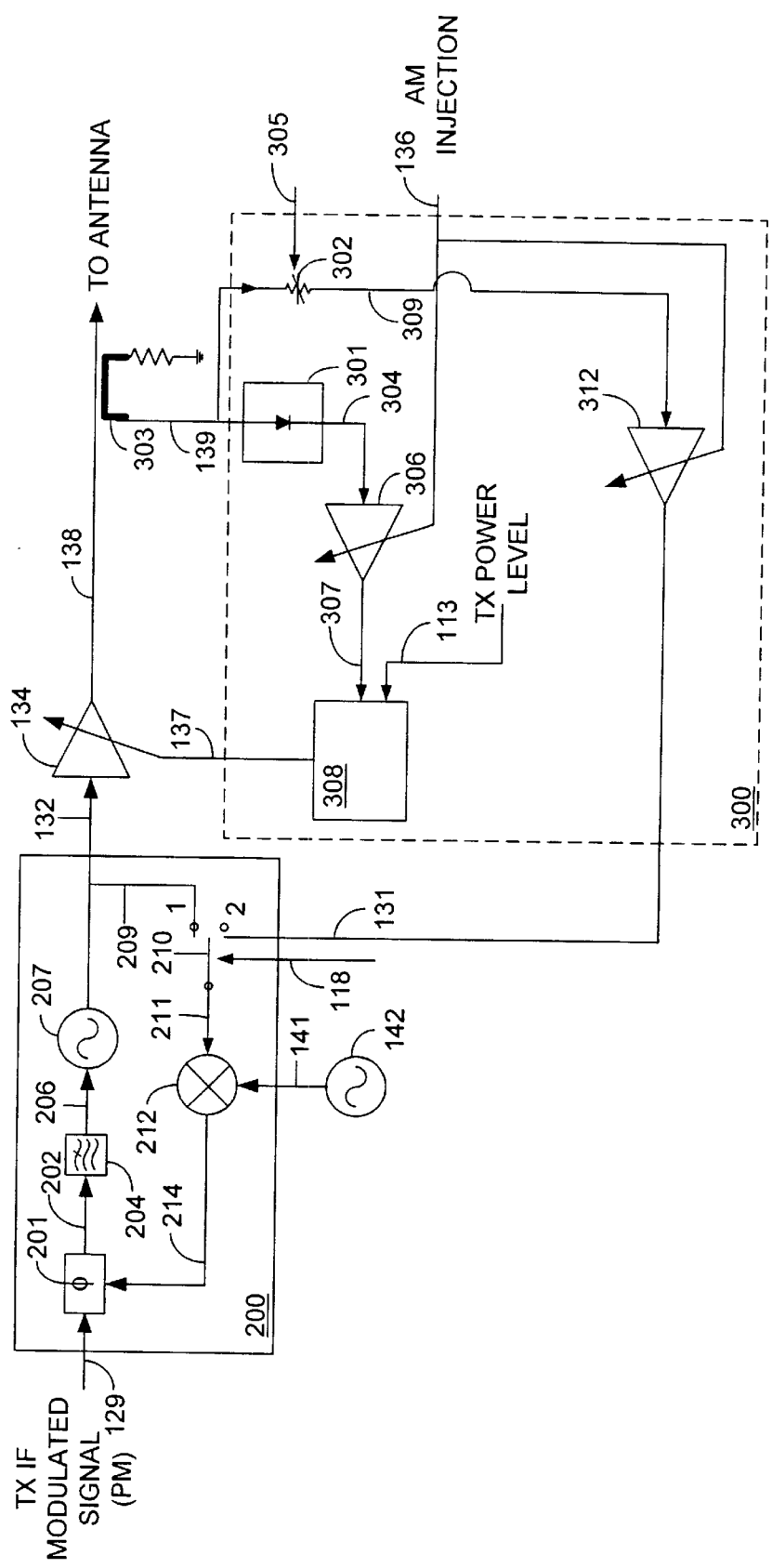
FIG. 2 is a block diagram illustrating the upconverter and power control element of FIG. 1 including the multiple step switched translation loop of the invention.

FIG. 2 is a block diagram illustrating the upconverter 200 and power control element 300 of FIG. 1 including the multiple step switched translation loop of the invention. Upconverter 200 receives an intermediate frequency (IF) modulated signal on connection 129 from modulator 127 (FIG. 1). The IF modulated signal on connection 129 is, for example purposes only, a phase modulated signal. The phase-modulated signal is supplied on connection 129 to phase detector 201. Phase detector 201 compares the phase of the signals supplied on connections 129 and 214, to be described below. The output of phase detector 201 is sent via connection 202 to low pass filter 204. Low pass filter 204 filters the signal on connection 202 and passes a signal at the appropriate frequency on connection 206 to transmit (TX) voltage controlled oscillator (VCO) 207. TX VCO 207 supplies a very clean modulated signal (i.e, a signal with very low out-of-band noise) via connection 132 to power amplifier 134. By using an oscillator 207 to supply a low-noise modulated signal to power amplifier 134, the need for filtering before and after the power amp 134 may be reduced or eliminated. The signal supplied from oscillator 207 to power amp 134 contains only a phase-modulated signal.

A portion of the output of TX VCO 207 is sent via connection 209, through switch 210, and through connection 211 to mixer 212. Mixer 212 mixes the portion of the output of TX VCO 207 with the output of synthesizer 142 (i.e., the local oscillator signal) supplied via connection 141. The output of mixer 212 is a signal having a frequency equal to the difference between the frequencies of TX VCO 207 and synthesizer 142. This difference in frequency is substantially the same as the frequency of the TX IF modulated signal on connection 129. The output of mixer 212 is then communicated via connection 214 to phase detector 201. Phase detector 201 detects any phase difference between the IF modulated signal on connection 129 and the output of mixer 212, and places a signal on connection 202 that has an amplitude proportional to this difference. Low-pass filter 204 integrates the signal on connection 202 and places a DC signal on connection 206 that controls the frequency of TX VCO 207. In this manner, TX VCO 207, connection 209, switch 210, connection 211, synthesizer 142, mixer 212, connection 214, phase detector 201, connection 202, filter 204, and connection 206 form a phase locked loop (PLL), which is used to determine the transmit frequency to which the signal input on connection 129 is upconverted. When this phase locked loop is settled, or "locked," then the two signals entering phase detector 201 on connections 129 and 214 have precisely the same frequency, and the phase detector output on connection 202 goes to zero. The output of the integrating low pass filter 204 on connection 206 stabilizes, resulting in a fixed frequency out of TX VCO 207. For example, the synthesizer 142 and the mixer 212 ensure that the frequency of the signal output from the TX VCO 207 on connection 132 tracks the sum of the frequencies of the local oscillator signal supplied by synthesizer 142 and the TX IF modulated signal on connection 129. Then, as the TX IF modulated signal on connection 129 changes its frequency over time, such frequency changes are precisely tracked by the TX VCO 207.

The operation of switch 210 is controlled so that during a first portion of a transmit burst, the switch 210 is placed in position 1 so that the input to mixer 212 is taken from the output of TX VCO 207. At a time defined by the baseband subsystem 107 and communicated to the RF subsystem 121 via connection 118, the position of switch 210 is changed to position 2 so that the input to mixer 212 is taken from the output of the variable gain element 312 within power control element 300 via connection 131. In this manner, during an initial portion of a transmit burst, which corresponds to a time when the output of power amplifier 134 is insufficient to provide an input to mixer 212, the phase locked loop in the upconverter 200 utilizes as its feedback signal the output of TX VCO 207. Then, when the output power of the power amplifier 134 reaches a level at which it can drive the mixer 212 with sufficient power, the position of switch 210 is changed so that the input to mixer 212 (and therefore the phase locked loop feedback for upconverter 200) is taken from the output of the power amplifier 134 through power control element 300 (to be described below). The operation of switch 210 can be controlled by a signal from microprocessor 108 via connection 118. Furthermore, the implementation and control of switch 210 may preferably be such that a "soft" switching function is achieved. For example, switch 210 may be implemented as a pair of continuously variable attenuators, one between connections 209 and 211, and one between connections 131 and 211. The attenuation of the former is gradually increased while the attenuation of the latter is gradually decreased. In this manner, the input to mixer 212 can be a smooth transition beginning with the output of the TX VCO 207 and, at the appropriate time, transitioning to the output of the variable gain element 312.

It is desirable to have the ability for power amplifier 134 to output a signal including both a PM signal and an AM signal. Unfortunately however, there are many drawbacks associated with supplying both a PM signal and an AM signal directly to power amplifier 134 via connection 132. For example, in order to amplify both a PM signal and an AM signal in amplifier 134, it would be necessary that amplifier 134 be a highly linear, and therefore very inefficient, power amplifier. A highly linear power amplifier is required to amplify both a PM and an AM signal in order to prevent undesirable and detrimental AM to PM conversion. AM to PM conversion occurs due to the inherent amplitude-dependence of an amplifier's phase-shift characteristic, which is most severe in the case of highly efficient amplifiers. In such amplifiers, the signal's AM causes the phase to be modulated as the amplifier's phase-shift characteristic varies with the signal amplitude, resulting in a distorted transmit signal. Unfortunately, linear amplifiers, which have low AM to PM conversion, are highly inefficient.

Therefore, because it is desirable to allow power amplifier 134 to output a signal containing both an AM component and a PM component, while maintaining power amplifier 134 as a non-linear (and therefore highly efficient) power amplifier, the AM portion of the signal is introduced into power amplifier 134 through its control channel via connection 137. A portion of the output power present at the output of power amplifier 134 on connection 138 is diverted by coupler 303 via connection 139 and input to power control element 300. A portion of the power on connection 139 is supplied to logarithmic (log) detector 301. Log detector 301 receives the RF signal on connection 139 and provides, on connection 304, a direct current (DC) baseband signal representing the level of the RF power signal present on connection 139. The output of log detector 301 on connection 304 is supplied as input to variable gain element 306.

Variable gain element 306 can be, for example but not limited to, a variable gain amplifier or an attenuator. An inverse version of the desired AM signal is injected via connection 136 to the variable input of variable gain element 306. In this manner, variable gain element 306 "unmodulates" the signal on connection 304. The output of the variable gain element 306 on connection 307 includes primarily a static (or slow-moving) signal, called the "power measurement signal," related to the absolute output power of power amplifier 134, plus a very small error signal related to the AM.

The output of the power amplifier 134 changes until the amplitude of the signal on connection 304 cancels that on connection 136. In this manner, the amplitude of the signal on connection 307 remains equal to that on connection 113. However, this implies that the signal on connection 304 slightly lags the signal on connection 136 with the result that the two signals will not completely cancel. In this manner, an error signal including an AM portion is present on connection 307.

The signal on connection 307 is amplified by power control comparator 308 sufficiently to drive the power amplifier control input on connection 137 so that the desired AM signal is included at the output of the power amplifier 134 on connection 138. The power control comparator 308 has sufficient gain so that the error signal on connection 307 can be kept small. In such a case, the signals on connections 136 and 304 may be substantially the inverse of each other. In addition to amplifing the AM related error signal on connection 307, power control comparator 308 also compares the power measurement signal on connection 307 with a reference voltage power signal supplied on connection 113 from DAC 119 of FIG. 1. The reference voltage power signal on connection 113 represents the desired static power output level for power amplifier 134, irrespective of AM modulation.

Power control comparator 308 compares the signal level on connection 307 with the signal level on connection 113 and then amplifies the difference, thus providing a power control signal on connection 137. The power control signal on connection 137 drives power amplifier 134 to the correct average output power. Because both the power measurement signal and the AM error signal are present on connection 307, it can be seen that power control comparator 308 provides a dual function: (1) it amplifies the AM-error signal on connection 307 so as to modulate the power output of power amplifier 134 via connection 137 to the correct amount of AM, and (2) it performs the average power comparison and amplifies the result, thus providing a control signal on connection 137 that drives the power amplifier 134 to the correct average power output. Therefore, at connection 137 both the AM error signal and the power control error signal are amplified to a level sufficient to drive the power amplifier 134 to the desired average power with the desired AM signal.

In this manner, the desired AM portion of the signal is supplied to the control input 137 of power amplifier 134 and made present on the output on connection 138. Log detector 301, variable gain element 306 and power control comparator 308 provide a closed power control feedback loop to control the power output of power amplifier 134, while allowing for the introduction of the AM portion of the transmit signal.

It should be noted that the operation of variable gain element 306 causes the inverse of the AM signal on connection 136 to be applied to the signal present on connection 304, thus providing an essentially constant amplitude signal on connection 307 for comparison with the desired TX power level signal on connection 113. The signal on connection 307 represents the average-power measurement, but also contains a small AM-related error signal.

Unfortunately, when the PM portion and AM portion of the signal are combined in, or supplied to, power amplifier 134 as described above, some unwanted phase modulation may be present on connection 138, thus resulting in undesirable AM-to-PM conversion. In order to prevent this unwanted AM to PM conversion, the detected portion of the power output on connection 139 is also supplied to attenuator 302. Attenuator 302 reduces the power of the signal and supplies the reduced power signal on connection 309 to the input of variable gain element 312. Similar to variable gain element 306, variable gain element 312 may be a variable gain amplifier or an attenuator. The control input to variable gain element 312 is the inverse AM injected signal supplied via connection 136. In this manner, the feedback signal supplied to switch 210 via connection 131 is free of any AM, thus avoiding any AM-to-PM conversion in mixer 212 or phase detector 201.

Attenuator 302 maintains a relatively constant average power level for the signal supplied to mixer 212 to be certain that sufficient signal amplitude is supplied to phase detector 201 so that the PLL formed by the upconverter 200 can lock. Attenuator 302 also allows variable gain element 312 to operate in approximately the same amplitude range regardless of the power level on connection 138, thus easing the design requirements of the variable gain element 312. In GSM systems, once the power output ramps up, transmitter output power can be in the range of +5 dBm to +33 dB. Preferably, the attenuator 302 is controlled such that the output on connection 309 remains relatively constant (i.e., within a few dB) for any transmitter output power.

As shown in FIG. 2, variable gain element 306 is preceded by a log detector (i.e., 301), while variable gain element 312 is not. Therefore, variable gain element 306 operates on a signal in logarithmic or "dB" space, while variable gain element 312 operates on a signal in linear space. The AM signal injected via connection 136 is a voltage representing dB. The variable gain element 306 varies its voltage output on connection 307 in proportion to the signal on connection 136 using a volt/volt control characteristic. Conversely, the variable gain amplifier 312 varies its voltage output on connection 131 in proportion to the signal on connection 136 using a dB/volt control characteristic.

The output of variable gain element 312 is supplied on connection 131 for input to switch 210 at the appropriate time determined by baseband subsystem 107. Switch 210 is controlled via connection 118 with a signal that originates in microprocessor 108. At the appropriate time (to be discussed below with respect to FIG. 3), the position of switch 210 is moved from position 1 to position 2, thus allowing the correction of any phase shift caused by power amplifier 134. In this manner, the PLL now includes the entire feedback loop essentially looping back the output of power amplifier 134 to the input of phase detector 201. Any unwanted phase shift generated by the power amplifier 134 will be corrected by the PLL of upconverter 200. The output of variable gain element 312 on connection 131 is preferably a constant amplitude signal that passes any phase distortion present on connection 138 to mixer 212 for correction by the PLL of upconverter 200. As such, the phase of the output of power amplifier 134 is forced to follow the phase of the TX IF modulated signal on connection 129.

Figure 3:
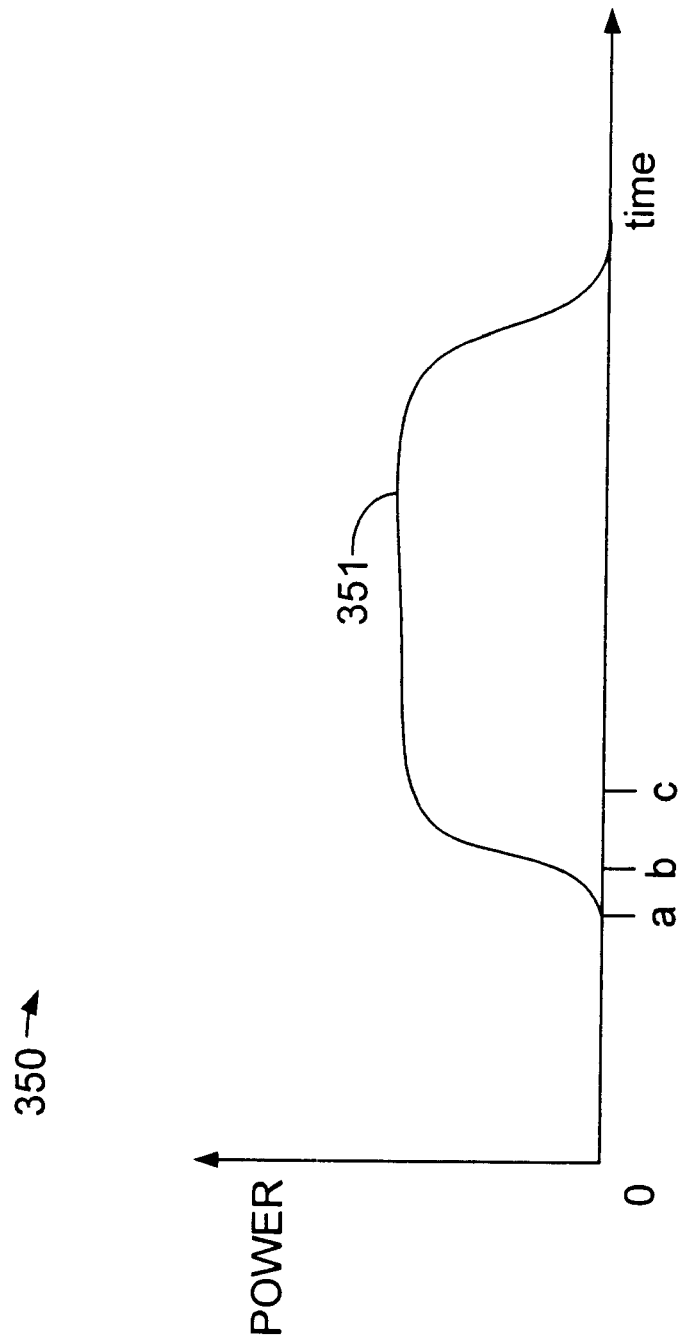
FIG. 3 is a graphical representation of the average power output of power amplifier of FIG. 2.

FIG. 3 is a graphical representation of the average power output of power amplifier 134 of FIG. 2. The vertical axis of graph 350 represents average power output of the power amplifier 134 and the horizontal axis of graph 350 represents time. Point "a" represents the point in time at which a transmission burst is initiated. At this time the microprocessor 108 of FIG. 1 applies a control signal to line 118 of switch 210, thus maintaining switch 210 in position 1. During the following ramp up time the PLL of FIG. 2 tracks only the output of TX VCO 207. Once the output of power amplifier 134 becomes sufficient to drive mixer 212 through attenuator 302 and variable gain amplifier 312, represented by point "b" in FIG. 3, the microprocessor 108 of FIG. 1 sends a control signal via connection 118 instructing switch 210 to begin transition to position 2. At such time, there is sufficient power output available from power amplifier 134 so that the input to mixer 212 can come from the output of power amplifier 134, thus allowing the synthesizer 142, mixer 212, and phase detector 201 to correct any phase distortion present at the output of power amplifier 134. The point "c" in FIG. 3 represents the point at which the power amplifier 134 has developed sufficient power so that transmission of data may begin.

Figure 4:
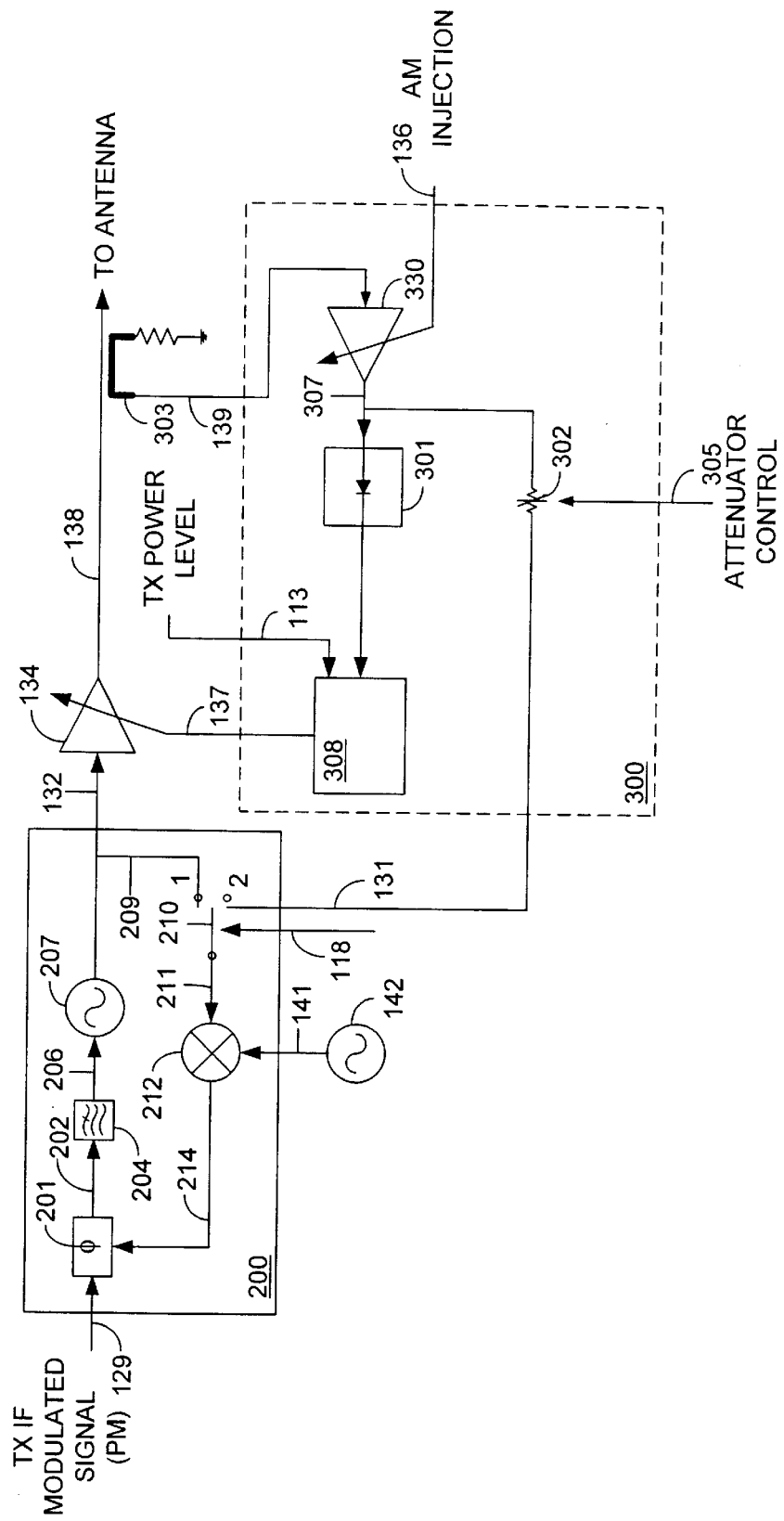
FIG. 4 is block diagram illustrating another aspect of the power control element of FIG. 2.

FIG. 4 is block diagram illustrating another aspect of the power control element 300 of FIG. 2. As illustrated in FIG. 4, a single variable gain element 330 supplies both the input to power control comparator 308 and the input to position 2 of switch 210 via connection 131. In this manner, a single variable gain element 330 can provide both power control and phase correction as described above with respect to FIG. 2. Variable gain element 330 is similar to variable gain element 312 of FIG. 2 in that it exhibits a dB/volt control characteristic.

The output of variable gain element 330 is supplied to both log detector 301 and to attenuator 302 both of which operate as described above with respect to FIG. 2.

Figure 5:
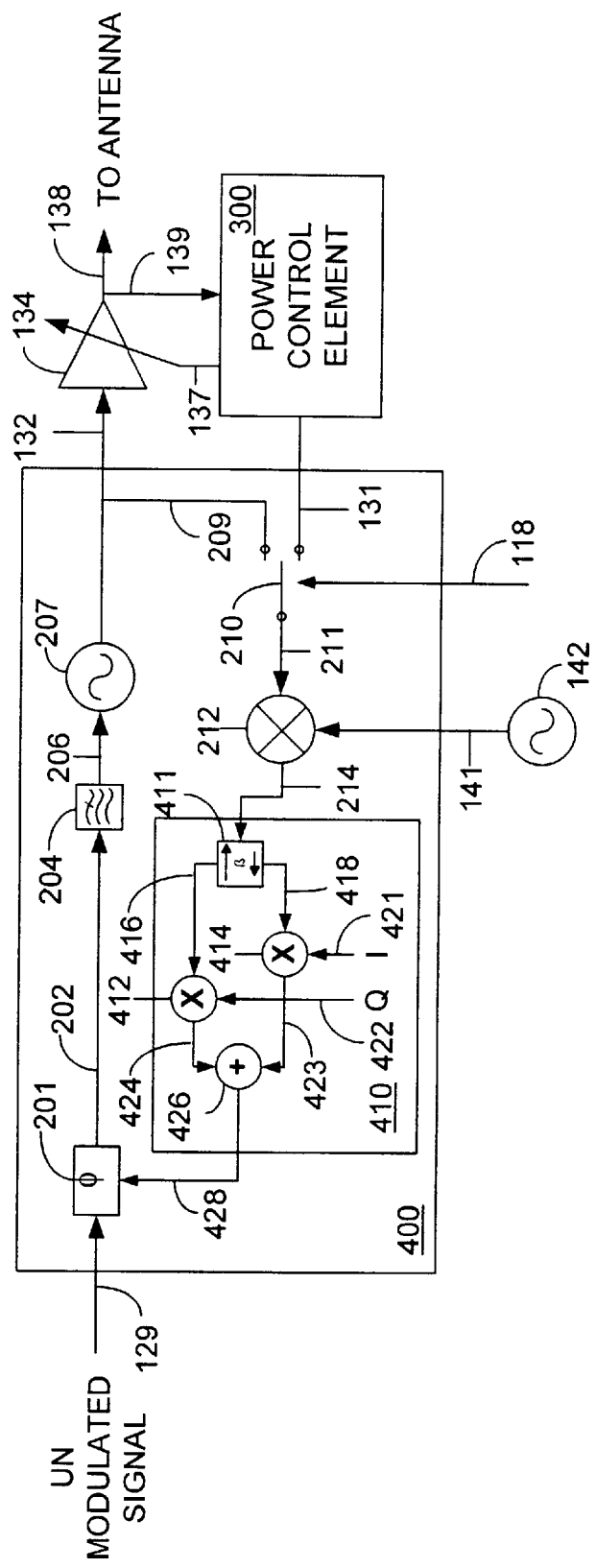
FIG. 5 is a block diagram illustrating another aspect of the upconverter of FIGS. 2 and 4.

FIG. 5 is a block diagram illustrating another aspect of the upconverter 200 of FIGS. 2 and 4. Elements that perform the same function as described above in FIGS. 2 and 4 are like numbered in FIG. 5. Referring now to FIG. 5, the output of mixer 212 is supplied via connection 214 to modulator 410. If modulator 410 is employed, then an unmodulated signal is supplied as input to phase detector 201 on line 129.

Modulator 410 includes phase shifter 411, which, according to this aspect of the invention, shifts the phase of the signal on connection 214 by 90 degrees, and supplies outputs via connections 416 and 418 to mixers 412 and 414, respectively. The in-phase (I) component of the transmit signal is supplied via connection 421 to mixer 414 and the quadrature (Q) component of the signal is supplied via connection 422 to mixer 412. The output of mixer 414 is the modulated phase rotated in-phase component of the transmit signal and is supplied on connection 423 to adder 426. The output of mixer 412 is the modulated phase rotated quadrature component of the transmit signal and it is supplied on connection 424 to adder 426. Adder 426 supplies the combined modulated transmit signal via connection 428 to phase detector 201. By placing modulator 410 in the phase locked loop of upconverter 400, the modulated signal on connection 428 is subtracted from phase detector 201, thus ensuring that the desired modulated signal is present at the output of TX VCO 207.

Figure 6:
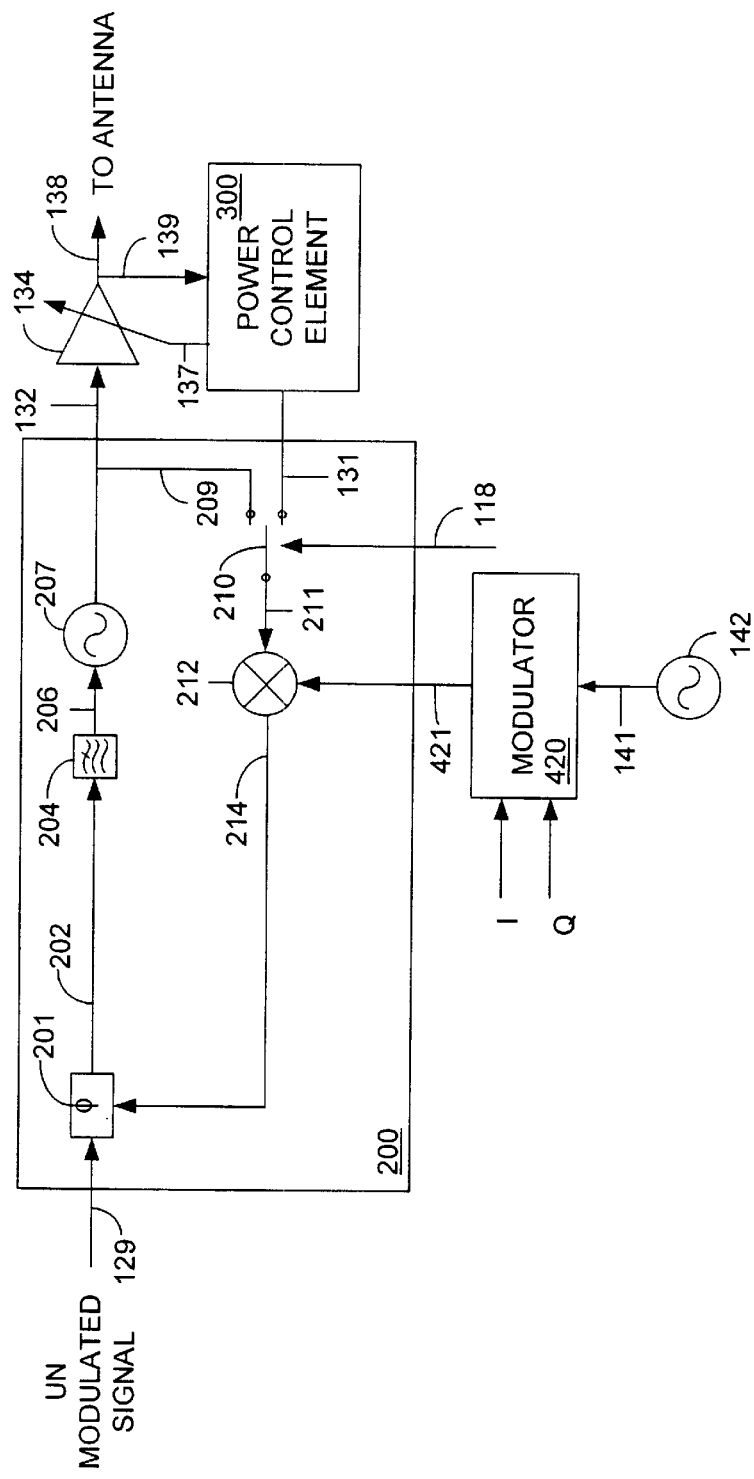
FIG. 6 is a block diagram illustrating another aspect of the upconverter of FIG. 5.

FIG. 6 is a block diagram illustrating another aspect of the upconverter 400 of FIG. 5. As illustrated in FIG. 6, modulator 420 is placed at the output of synthesizer 142 whereby the in-phase and quadrature components of the transmit signal are modulated in modulator 420 and supplied via connection 421 to mixer 212. In this manner, the modulated transmit signal is introduced into the phase locked loop of upconverter 200.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

What is claimed is:

1. A method for using a translation loop modulator and power amplifier in a phase and amplitude modulated transmission environment, comprising the steps of:

providing a phase modulated signal to a translation loop, the translation loop providing a frequency specific phase modulated signal, the translation loop also having a phase locked loop;

providing said frequency specific phase modulated signal to a power amplifier;

providing an amplitude modulated signal to the power amplifier using a variable gain element associated with a control loop;

detecting a portion of an output of the translation loop and a portion of an output power of the power amplifier;

applying the detected output portion of the translation loop to an input of the translation loop during a first time period; and applying the detected output power portion of the power amplifier to the input of the translation loop modulator during a second time period, wherein the detected output power portion of the power amplifier that is supplied during the second time period is a substantially constant power level signal containing only phase information.

2. The method of claim 1, wherein the variable gain element is a variable gain amplifier.

3. The method of claim 1, wherein the variable gain element is an attenuator.

4. The method of claim 1, wherein the variable gain element operates on a radio frequency (RF) signal.

5. The method of claim 1, wherein the variable gain element operates on a baseband signal representing the radio frequency (RF) power level of the output power of the power amplifier.

6. The method of claim 1, wherein the first time period and the second time period overlap.

7. The method of claim 1, wherein the detected output power portion of the power amplifier is applied to the input of the translation loop using the variable gain element.

8. The method of claim 1, further comprising the step of applying the detected output portion of the power amplifier to the input of the translation loop using a second variable gain element.

9. A system for using a translation loop and power amplifier in a phase and amplitude modulated transmission environment, comprising:

a translation loop having a phase locked loop and configured to receive a phase modulated signal, the translation loop also configured to provide a frequency specific phase modulated signal;

a power amplifier configured to receive the frequency specific phase modulated signal;

a control loop having a variable gain element configured to provide an amplitude modulated signal to the power amplifier;

a switching element configured to receive a portion of an output of the translation loop and a portion of an output power of the power amplifier, the switching element configured to apply the output portion of the translation loop to an input of the translation loop during a first time period and configured to apply the detected output power portion of the power amplifier to the input of the translation loop during a second time period, wherein the detected output power portion of the power amplifier that is supplied during the second time period is a substantially constant power level signal containing only phase information.

10. The system of claim 9, wherein the variable gain element is an amplifier.

11. The system of claim 9, wherein the variable gain element is an attenuator.

12. The system of claim 9, wherein the variable gain element operates on a radio frequency (RF) signal.

13. The system of claim 9, wherein the variable gain element operates on a baseband signal representing the radio frequency (RF) power level of the output power of the power amplifier.

14. The system of claim 9, wherein the first time period and the second time period overlap.

15. The system of claim 9, wherein the detected output power portion of the power amplifier is applied to the input of the translation loop using the variable gain element.

16. The system of claim 9, further comprising a second variable gain element configured to apply the detected output power portion of the power amplifier to the input of the translation loop.

17. A computer readable medium having a program for using a translation loop modulator and power amplifier in a phase and amplitude modulated transmission environment, the program comprising logic configured to perform the steps of:

providing a phase modulated signal to a translation loop, the translation loop providing a frequency specific phase modulated signal, the translation loop also having a phase locked loop;

providing said frequency specific phase modulated signal to a power amplifier;

providing an amplitude modulated signal to the power amplifier using a variable gain element associated with a control loop;

detecting a portion of an output of the translation loop and a portion of an output power of the power amplifier;

applying the detected output portion of the translation loop to an input of the translation loop during a first time period; and applying the detected output power portion of the power amplifier to the input of the translation loop modulator during a second time period, wherein the detected output power portion of the power amplifier that is supplied during the second time period is a substantially constant power level signal containing only phase information.

18. The computer readable medium of claim 17, wherein the variable gain element is an amplifier.

19. The computer readable medium of claim 17, wherein the variable gain element is an attenuator.

20. The computer readable medium of claim 17, wherein the variable gain element operates on a radio frequency (RF) signal.

21. The computer readable medium of claim 17, wherein the variable gain element operates on a baseband signal representing the radio frequency (RF) power level of the output power of the power amplifier.

22. The computer readable medium of claim 17, wherein the first time period and the second time period overlap.

23. The computer readable medium of claim 17, wherein the detected output power portion of the power amplifier is applied to the input of the translation loop using the variable gain element.

24. The computer readable medium of claim 17, further comprising the step of applying the detected output portion of the power amplifier to the input of the translation loop using a second variable gain element.

25. A power amplifier including a translation loop modulator, comprising:

means for providing a phase modulated signal to a translation loop, the translation loop providing a frequency specific phase modulated signal, the translation loop also having a phase locked loop;

means for providing said frequency specific phase modulated signal to a power amplifier;

means for providing an amplitude modulated signal to the power amplifier using a variable gain element associated with a control loop;

means for detecting a portion of an output of the translation loop and a portion of an output power of the power amplifier;

means for applying the detected output portion of the translation loop to an input of the translation loop during a first time period; and means for applying the detected output power portion of the power amplifier to the input of the translation loop modulator during a second time period, wherein the detected output power portion of the power amplifier that is supplied during the second time period is a substantially constant power level signal containing only phase information.

26. The power amplifier of claim 25, wherein the variable gain element is a variable gain amplifier.

27. The power amplifier of claim 25, wherein the variable gain element is an attenuator.

28. The power amplifier of claim 25, wherein the variable gain element operates on a radio frequency (RF) signal.

29. The power amplifier of claim 25, wherein the variable gain element operates on a baseband signal representing the radio frequency (RF) power level of the output power of the power amplifier.

30. The power amplifier of claim 25, wherein the first time period and the second time period overlap.

31. The power amplifier of claim 25, further comprising means for applying the detected output power portion of the power amplifier to the input of the translation loop using the variable gain element.

32. The power amplifier of claim 25, further comprising means for applying the detected output portion of the power amplifier to the input of the translation loop using a second variable gain element.

* * * * *